(12) United States Patent
Ishido

(10) Patent No.: US 8,367,939 B2
(45) Date of Patent: Feb. 5, 2013

(54) INTERCONNECT SUBSTRATE, METHOD OF MANUFACTURING INTERCONNECT SUBSTRATE AND SEMICONDUCTOR DEVICE

(75) Inventor: Kiminori Ishido, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 226 days.

(21) Appl. No.: 12/654,017

(22) Filed: Dec. 8, 2009

(65) Prior Publication Data
US 2010/0139963 A1 Jun. 10, 2010

(30) Foreign Application Priority Data
Dec. 10, 2008 (JP) ................... 2008-314114

(51) Int. Cl.
*H05K 1/16* (2006.01)
(52) U.S. Cl. .......... 174/260; 174/250; 174/255; 29/825; 29/829
(58) Field of Classification Search .................. 174/250, 174/255, 260, 262; 29/825, 846
See application file for complete search history.

(56) References Cited

U.S. PATENT DOCUMENTS

| | | | | |
|---|---|---|---|---|
| 3,436,818 | A * | 4/1969 | Merrin et al. .................... | 29/840 |
| 6,217,987 | B1 * | 4/2001 | Ono et al. ...................... | 428/209 |
| 6,376,049 | B1 * | 4/2002 | Asai et al. ..................... | 428/209 |
| 6,392,898 | B1 * | 5/2002 | Asai et al. ..................... | 361/794 |
| 6,411,519 | B2 * | 6/2002 | Asai et al. ..................... | 361/794 |
| 6,586,843 | B2 * | 7/2003 | Sterrett et al. ................. | 257/778 |
| 6,613,986 | B1 * | 9/2003 | Hirose et al. .................. | 174/255 |
| 6,627,824 | B1 * | 9/2003 | Lin ............................... | 174/268 |
| 6,930,258 | B1 * | 8/2005 | Kawasaki et al. ............. | 174/264 |
| 7,043,830 | B2 * | 5/2006 | Farnworth ...................... | 29/842 |
| 7,129,158 | B2 * | 10/2006 | Nakai ............................ | 438/613 |
| 7,178,234 | B2 * | 2/2007 | Kawasaki et al. .............. | 29/852 |
| 7,361,849 | B2 * | 4/2008 | Asai et al. ...................... | 174/262 |

(Continued)

FOREIGN PATENT DOCUMENTS
JP 63249666 A * 10/1988
JP 11-176985 (A) 7/1999
(Continued)

OTHER PUBLICATIONS
Notification of Reasons for Rejection dated Jul. 17, 2012, with English-language translation.
(Continued)

*Primary Examiner* — Robert J Hoffberg
(74) *Attorney, Agent, or Firm* — McGinn IP Law Group, PLLC (57) ABSTRACT

Embodiments of the invention provide an interconnect substrate capable of improving the connection reliability and yield of a semiconductor device, a method of manufacturing the interconnect substrate, and a semiconductor device using the interconnect substrate. An interconnect substrate according to an embodiment of the invention includes: a substrate; an electrode pad formed over the substrate; an insulating film (solder resist film) formed over the substrate; an opening formed in the insulating film, in which the upper surface of the electrode pad is exposed on the bottom surface of the opening and a metal film formed over the upper surface of the electrode pad and side surface of the insulating film in the opening. At least a portion of the edge of an upper surface of the metal film is higher than the other portions of the upper surface of the metal film.

27 Claims, 5 Drawing Sheets

U.S. PATENT DOCUMENTS

| | | |
|---|---|---|
| 7,414,317 B2 | 8/2008 | Lee et al. |
| 7,449,781 B2 * | 11/2008 | Nakai ............................ 257/762 |
| 7,525,190 B2 * | 4/2009 | Hirose et al. ................... 257/700 |
| RE41,051 E * | 12/2009 | Asai et al. ...................... 361/794 |
| RE41,242 E * | 4/2010 | Asai et al. ...................... 361/794 |
| 7,795,542 B2 * | 9/2010 | Kawasaki et al. .............. 174/262 |
| 7,999,194 B2 * | 8/2011 | Kawasaki et al. .............. 174/264 |
| 8,013,256 B2 * | 9/2011 | Nakai ............................ 174/257 |
| 8,018,046 B2 * | 9/2011 | Hirose et al. ................... 257/700 |
| 8,058,564 B2 * | 11/2011 | Hu ................................ 174/257 |
| 8,164,003 B2 * | 4/2012 | Tang et al. ..................... 174/261 |
| 2008/0217046 A1 * | 9/2008 | Tang et al. ..................... 174/257 |
| 2008/0217047 A1 * | 9/2008 | Hu ................................ 174/257 |
| 2012/0006591 A1 * | 1/2012 | Kaneko et al. ................. 174/262 |

FOREIGN PATENT DOCUMENTS

| | | |
|---|---|---|
| JP | 2000-40764 A | 2/2000 |
| JP | 2003-133711 | 5/2003 |
| JP | 2006-024889 | 1/2006 |
| JP | 2007-019430 | 1/2007 |

OTHER PUBLICATIONS

Notice of Reasons for Refusal dated Oct. 2, 2012, with partial English-language translation.

* cited by examiner

INTERCONNECT SUBSTRATE, METHOD OF MANUFACTURING INTERCONNECT SUBSTRATE AND SEMICONDUCTOR DEVICE

The application is based on Japanese patent application No. 2008-314114, the content of which is incorporated hereinto by reference.

BACKGROUND

1. Technical Field

The invention relates to an interconnect substrate, a method of manufacturing an interconnect substrate, and a semiconductor device.

2. Related Art

Semiconductor devices have been proposed in which a semiconductor chip is electrically connected to an interconnect substrate through solder balls.

Figure 6:
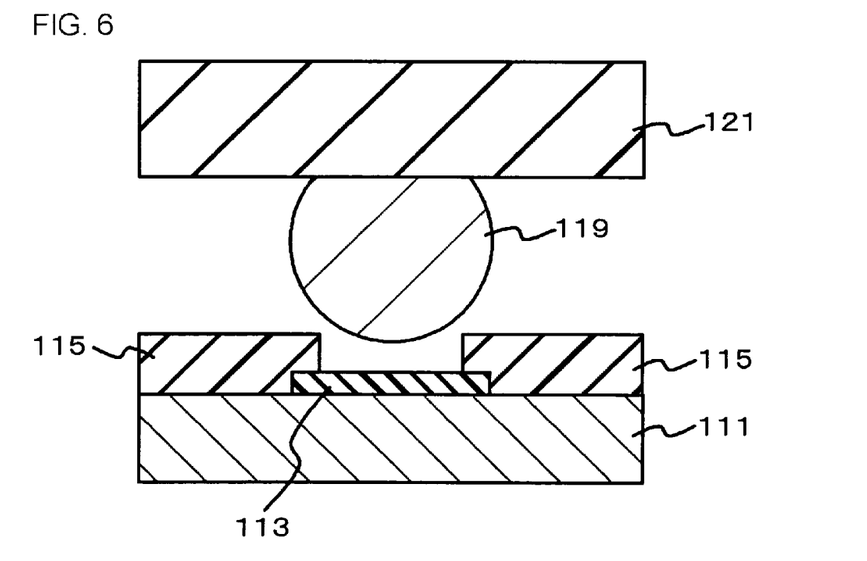
FIG. 6 is a cross-sectional view illustrating the problems of the invention.
Figure 7:
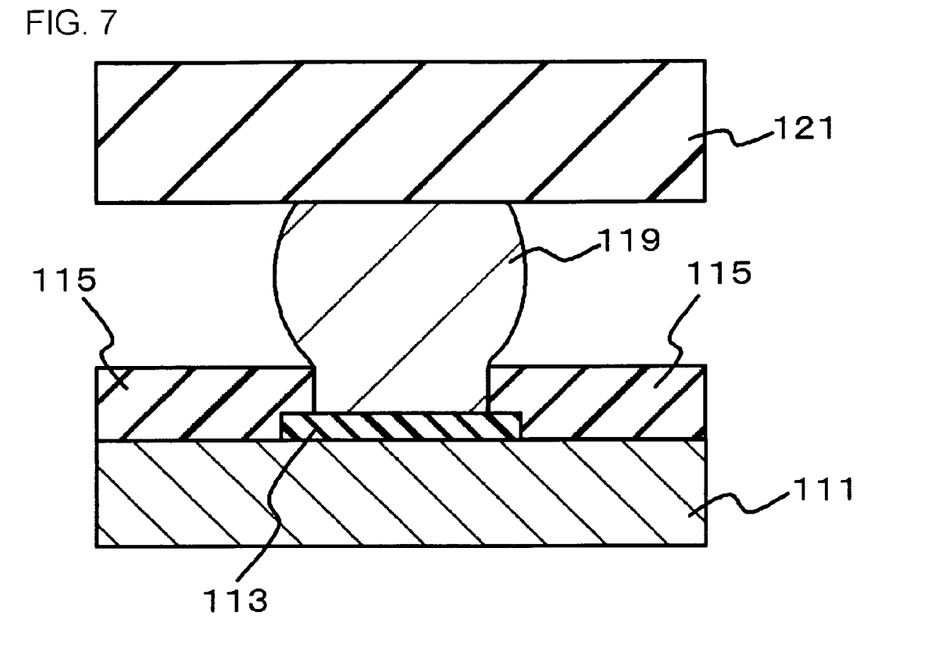
FIG. 7 is a cross-sectional view illustrating the structure of an interconnect substrate according to the related art.

Japanese Unexamined Patent Publication No. 2000-40764 (see FIG. 6) discloses a semiconductor device including a substrate 111, electrode pads 113 that are formed on the substrate 111, a solder resist film 115 that covers the edge of the electrode pad 113, a semiconductor chip 121, and solder balls 119 that connect the semiconductor chip 121 and the electrode pads on the substrate 111, as shown in FIG. 7.

A plating film (not shown) having high wettability with solder is formed between the solder ball 119 and the electrode pad 113 on the substrate 111. The semiconductor chip 121 is mounted on the substrate 111 with the solder balls 119 interposed therebetween, and a heat treatment, which is called reflow, is performed to electrically connect the semiconductor chip and the substrate.

However, the technique disclosed in Japanese Unexamined Patent Publication No. 2000-40764 has the following problems.

As a result of the reflow, the solder moves to the semiconductor chip 121, as shown in FIG. 6, which results in a connection defect between the substrate 111 and the semiconductor chip 121. As a result, the connection reliability of products is reduced.

SUMMARY

In one embodiment, there is provided an interconnect substrate including: a substrate; an electrode pad formed over the substrate; an insulating film formed over the substrate; an opening formed in the insulating film, in which the upper surface of the electrode pad is exposed on the bottom surface of the opening; and a metal film formed over the upper surface of the electrode pad and side surface of the insulating film in the opening. At least a portion of the edge of an upper surface of the metal film is higher than the other portions of the upper surface of the metal film.

In the interconnect substrate according to the above-mentioned embodiment of the invention, at least a portion of the edge of the upper surface of the metal film is higher than the other portions of the upper surface. Therefore, it is possible to improve the adhesion between the metal film and the solder ball and thus prevent the moving of solder to one side during reflow. In this way, it is possible to improve the connection reliability of a semiconductor device and the yield of the semiconductor device.

In another embodiment, there is provided a method of manufacturing an interconnect substrate. The method includes: forming an insulating film over a substrate having electrode pads; forming openings through which the upper surfaces of the electrode pads are exposed in the insulating film; and depositing a metal material over the upper surface of the electrode pad and a side surface of the insulating film in each of the openings such that at least a portion of the edge of the metal film is higher than the other portions.

The method of manufacturing the interconnect substrate according to the above-mentioned embodiment of the invention includes a step of forming the metal film in which at least a portion of the edge is higher than the other portions. Therefore, it is possible to easily obtain a semiconductor device with high connection reliability and high manufacturing yield.

In still another embodiment, there is provided a semiconductor device including: the interconnect substrate; and a semiconductor chip that is mounted over the interconnect substrate. The semiconductor chip is electrically connected to the interconnect substrate through solder balls.

In the interconnect substrate according to the above-mentioned aspect of the invention, at least a portion of the edge of the upper surface of the metal film is higher than the other portions of the upper surface. Therefore, it is possible to improve the adhesion between the metal film and the solder ball and thus prevent the moving of solder to one side during reflow. In this way, it is possible to improve the connection reliability of a semiconductor device and the yield of the semiconductor device.

According to the above-mentioned aspects of the invention, it is possible to provide an interconnect substrate capable of improving the connection reliability and yield of a semiconductor device, a method of manufacturing the interconnect substrate, and a semiconductor device using the interconnect substrate.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, exemplary embodiments of the invention will be described with reference to the accompanying drawings. In the drawings, the same components are denoted by the same reference numerals and a detailed description thereof will not be repeated.

Figure 1A:
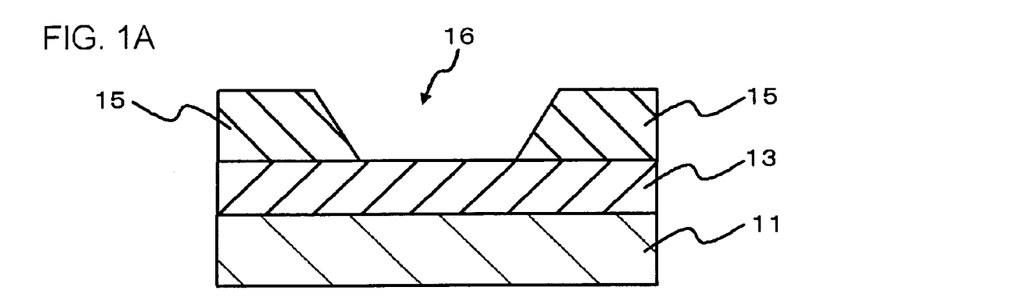
FIGS. 1A to 1C are cross-sectional views schematically illustrating a method of manufacturing an interconnect substrate according to an embodiment of the invention.
Figure 1B:
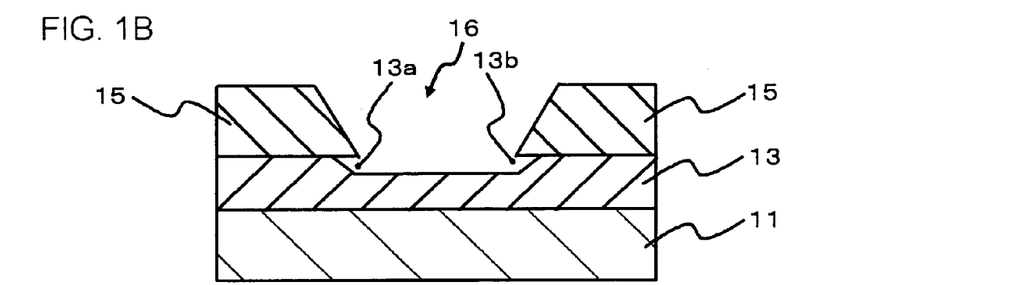
Figure 1C:
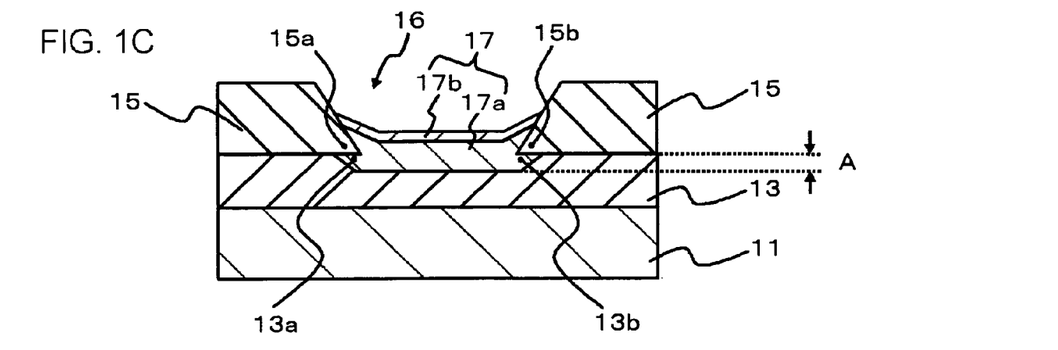
Figure 3:
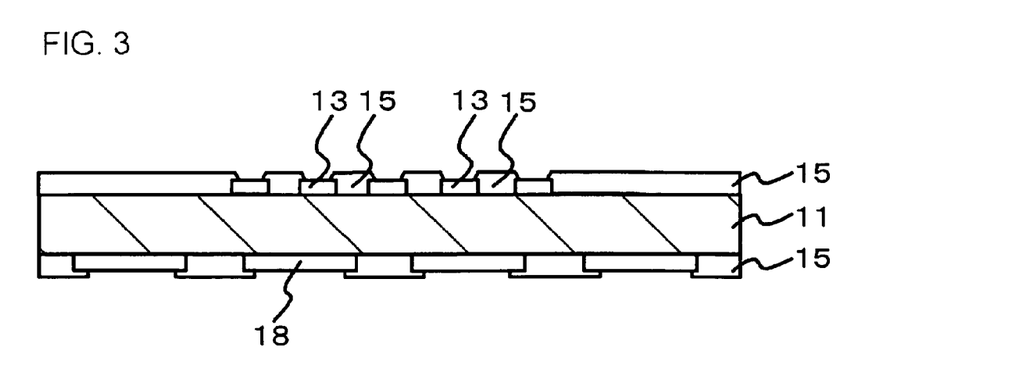
FIG. 3 is a cross-sectional view schematically illustrating the overall structure of the interconnect substrate according to the embodiment.

As shown in FIGS. 1C and 3, an interconnect substrate according to an embodiment includes a substrate 11, electrode pads 13 formed over the substrate, an insulating film (solder resist film 15) formed over the substrate 11. Openings are formed in the solder resist film 15. Each of the openings 16 has a tapered shape in which the diameter thereof is increased upward, and the upper surface of the electrode pad 13 is exposed on the bottom surface of the opening 16. In addition, in the opening 16, a metal film 17 is formed on the upper surface of the electrode pad 13 and an inclined side surface of the solder resist film 15.

In this embodiment, an interconnect substrate including a flip chip mounting pad will be described as an example.

As shown in FIGS. 1C and 3, the solder resist film 15 covers the edge of the electrode pad 13. The lower side of the opening 16 is provided at a position lower than the upper surface of the electrode pad 13, and is also provided below the solder resist film 15 (undercut portions 13a and 13b).

In the opening 16, since the metal film 17 covers the upper surface of the electrode pad 13 and a portion of the side surface of the solder resist film 15, at least a portion of the edge of the upper surface of the metal film 17 is higher than the other portions of the upper surface.

The metal film 17 includes a Ni-plating film 17a and an Au-plating film 17b. The thickness of the Ni-plating film 17a is more than a distance A from the lower surface of the solder resist film 15 to the upper surface of the electrode pad 13 in the opening 16. The edge of the Ni-plating film 17a covers a portion of the side surface of the solder resist film 15, and at least a portion of the edge of the upper surface of the Ni-plating film 17a is higher than the other portions of the upper surface.

In this way, even when the Au-plating film 17b is melted into a solder ball during a reflow process, at least a portion of the edge of the upper surface of the Ni-plating film 17a can be higher than the other portions of the upper surface.

The Ni-plating film 17a is also provided below bottom corners 15a and 15b of the solder resist film 15 (undercut portions 13a and 13b, respectively), and has a wedge shape in a cross-sectional view.

In this way, the interconnect substrate according to this embodiment has a solder mask defined (SMD) structure.

As shown in FIG. 3, the interconnect substrate according to this embodiment has the structure shown in FIG. 1C on one surface thereof. BGA pads 18 and a solder resist film 15 are formed on the other surface of the substrate 11 such that the solder resist film covers the edge of the BGA pad 18.

Next, a method of manufacturing the interconnect substrate according to this embodiment will be described.

The method of manufacturing the interconnect substrate according to this embodiment includes the following steps. In this embodiment, a method of manufacturing a flip chip mounting pad will be described.

(a) Step of forming an insulating film (solder resist film 15) on the substrate 11 having the electrode pads 13.

(b) Step of forming the openings 16, in which the upper surfaces of the electrode pads 13 are exposed on the bottom surface thereof, in the solder resist film 15 (FIG. 1A).

(c) Step of etching the upper surface of each of the electrode pads 13 exposed on the bottom surfaces of the openings 16 and etching the electrode pads disposed below said insulating film 15 (FIG. 1B).

(d) Step of depositing a metal material on the upper surface of the electrode pads 13 that is exposed on the bottom surface of the opening 16 and an inclined side surface of the solder resist film 15 to form the metal film 17 (FIG. 1C).

Next, the steps will be sequentially described.

Step (a): the insulating film (solder resist film 15) is formed on the substrate 11 having the electrode pads 13 provided thereon.

For example, a coating method may be used to form the solder resist film 15. A positive photo solder resist film may be used as the solder resist film 15.

Step (b): the openings 16, in which the upper surfaces of the electrode pads 13 are exposed on the bottom surface thereof, is formed in the solder resist film 15 obtained by the step (a) (FIG. 1A).

The openings 16 are formed in the solder resist film 15 by a predetermined photolithography technique to form the solder mask defined (SMD) structure. In this embodiment, for example, each of the openings 16 has a tapered shape in which the diameter is increased upward. In this case, the type or the development conditions of the solder resist film 15 are appropriately adjusted to form the opening 16 having the tapered shape.

Step (c): the upper surfaces of the electrode pads 13 that are exposed on the bottom surface of the openings 16 are etched and the electrode pads 13 disposed below the solder resist film 15 are etched (FIG. 1B).

Wet etching is performed on the upper surface of the electrode pad 13 to form the undercut portions 13a and 13b below the bottom corners 15a and 15b of the solder resist film 15, respectively. In this embodiment, the electrode pad 13 is made of Cu.

Chemicals for the wet etching may include, for example, a mixture of hydrogen peroxide and sulfuric acid, sodium persulfate, and ammonium persulfate. The conditions of the wet etching may be appropriately changed. The amount of etching may be in the range of 1 to 8 μm.

A lower layer of the solder resist film 15 with low crosslink density may be selectively melted to form the undercut portions 13a and 13b. Therefore, it is preferable that a process (desmear) using permanganate be performed before the wet etching.

In addition, a positive photo solder resist film may be used as the solder resist film, and after a development process is completed, a UV curing process may be performed before a thermal curing process to accelerate the formation of the undercut portions using the shrinkage of the solder resist film.

Step (d): a metal material is deposited on the upper surface of the electrode pad 13 exposed through the opening 16 and the inclined side surface of the solder resist film 15 to form the metal film 17 (FIG. 1C).

The metal film 17 includes the Ni-plating film 17a and the Au-plating film 17b. The Ni-plating film 17a is formed at a plating rate of 0.2 to 0.6 μm/min, and the thickness of the Ni-plating film 17a is more than the distance (A) from the bottom corners 15a and 15b of the solder resist film 15 to the electrode pad 13. In this embodiment, the Ni-plating film 17a and the Au-plating film 17b may be formed by an electroless plating method.

The thickness of the Au-plating film 17b is not particularly limited.

In this way, at least a portion of the edge of the upper surface of the metal film 17 can be higher than the other portions of the upper surface.

Figure 2:
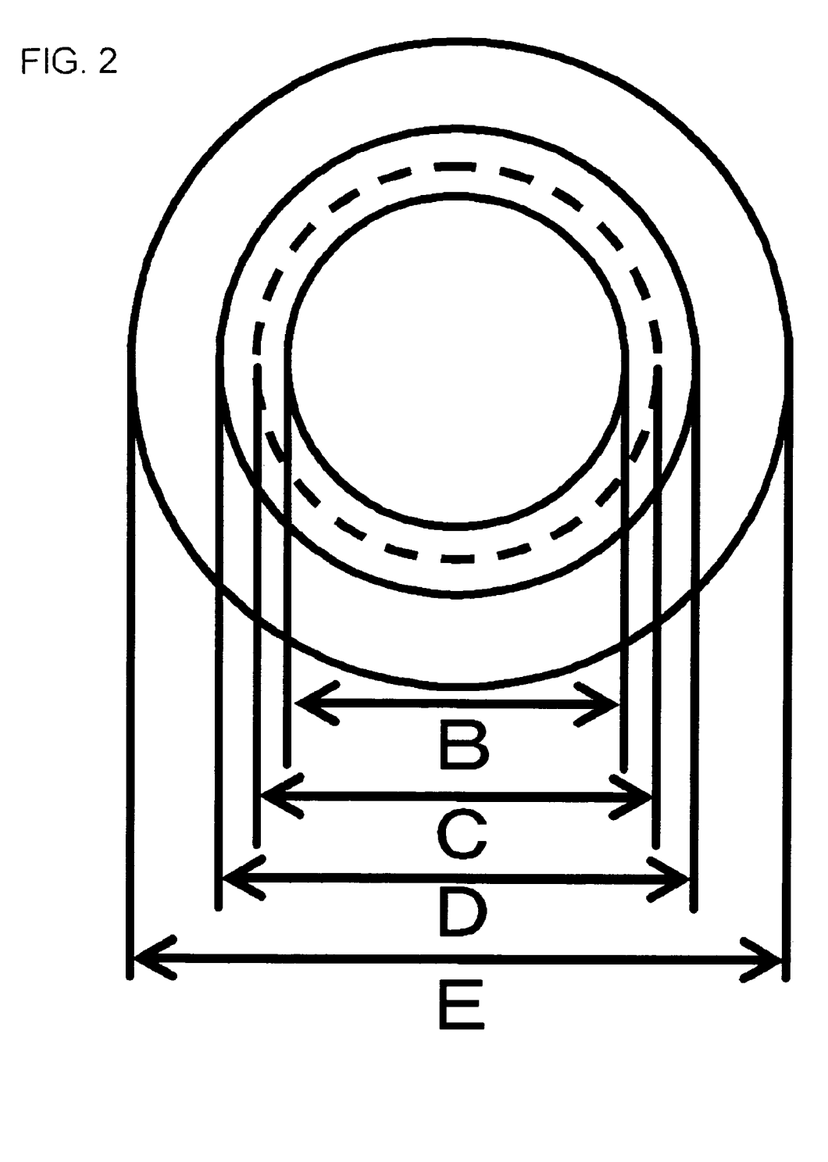
FIG. 2 is a plan view illustrating a mounting pad of the interconnect substrate according to the embodiment.

FIG. 2 is a plan view illustrating the interconnect substrate shown in FIG. 1C. In FIG. 2, B indicates the bottom diameter of the solder resist film 15, C indicates the diameter of the undercut portions 13a and 13b of the electrode pad 13, D indicates the diameter of the opening formed in the upper surface of the solder resist film 15, and E indicates the diameter of the electrode pad 13 of the interconnect substrate.

The interconnect substrate manufactured in this way has the structure shown in FIG. 3.

As shown in FIG. 3, the flip chip mounting pads are provided on one surface of the substrate 11, and the BGA pads 18 are formed on the other surface of the substrate 11 so as to be exposed through the openings formed in the solder resist film 15.

Figure 4:
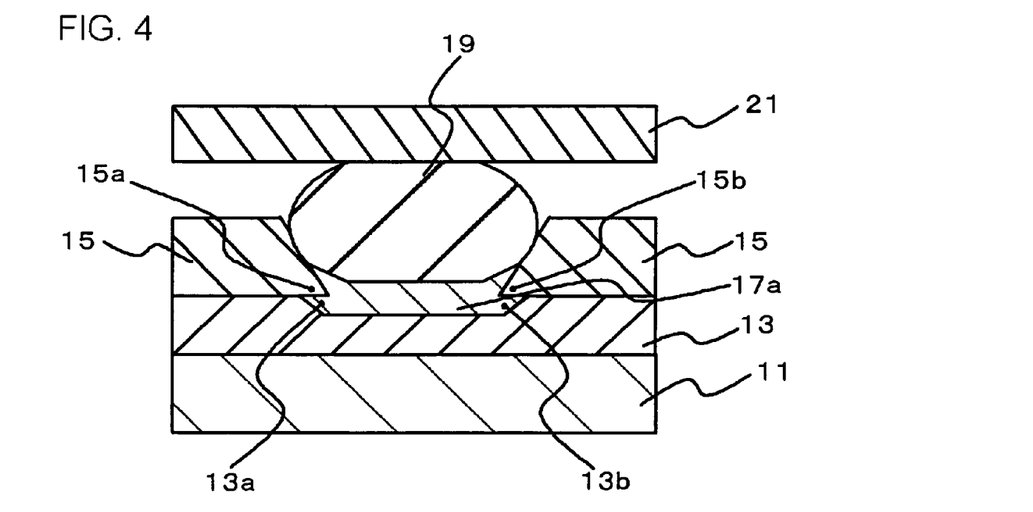
FIG. 4 is a cross-sectional view illustrating a semiconductor device in which a semiconductor chip is mounted on the interconnect substrate according to the embodiment.
Figure 5:
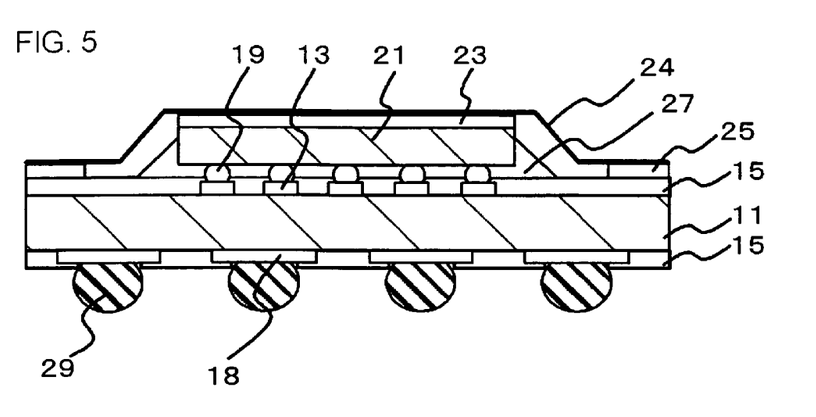
FIG. 5 is a cross-sectional view schematically illustrating the overall structure of the semiconductor device according to the embodiment.

A semiconductor device according to this embodiment may be manufactured by a general method using the above-mentioned interconnect substrate. As shown in FIGS. 4 and 5, in the semiconductor device according to this embodiment, a semiconductor chip 21 is electrically connected to the interconnect substrate through solder balls 19. In order to electrically connect the semiconductor chip 21 to the interconnect substrate, the semiconductor chip 21 is mounted on the metal film 17 with the solder balls 19 interposed therebetween, and a heat treatment, which is called reflow, is performed. During the heat treatment, the Au-plating film 17b is melted into the solder ball 19, and the solder ball 19 is connected to the Ni-plating film 17a. In addition, BGA solder 29 are formed on the BGA pads 18 on the rear surface of the interconnect substrate.

An underfill resin 27 is filled between the semiconductor chip 21 and the interconnect substrate. A thermally conductive adhesive 23 is coated on the upper surface of the semiconductor chip 21 and an adhesive 25 is coated on the solder resist film 15. In this way, a radiator plate 24 is provided so as to cover the semiconductor device.

Next, the effects of this embodiment will be described.

In general, the electrode pad and the metal film (plating film) are formed such that their surfaces are horizontal. Therefore, during solder reflow, the moving of solder to one side occurs, which results in a connection defect between the substrate and the semiconductor chip.

In order to solve the above-mentioned problems, the inventors have examined the mechanism of the moving of solder to one side.

When the metal film formed on the electrode pad 13 has a horizontal surface, the melted solder ball contacted with the metal film tends to maintain a spherical shape through a surface tension. Therefore, when the contact area between the metal film and the melted solder ball is small, adhesion is reduced, which results in the moving of solder to one side. Even though the contact area is increased with the upper surface of the metal film being maintained horizontally, the adhesion between the metal film and the melted solder ball is not sufficient, which results in t the moving of solder to one side.

Therefore, the inventors have conducted an examination to find the correlation between the moving of solder to one side and the shape of the metal film 17 on the interconnect substrate. That is, the inventors found that, when at least a portion of the edge of the upper surface of the metal film 17 was higher than the other portions, the contact area between the upper surface of the metal film 17 and the solder ball 19 was increased and it was possible to distribute the surface tension of the melted solder ball that tends to maintain a spherical shape, resulting in an increase in adhesion.

According to the above-mentioned structure, it is possible to improve the bonding strength between the metal film 17 and the solder ball 19 and prevent the moving of solder to one side during reflow. In this way, it is possible to improve the connection reliability of a semiconductor device and the yield of the semiconductor device.

In this embodiment, the metal film 17 may be formed such that the height of the upper surface thereof increases toward the edge. According to this structure, it is possible to increase the contact area between the upper surface of the metal film 17 and the solder ball 19 and further distribute the surface tension of the melted solder ball 19. As a result, it is possible to further improve adhesion.

In the interconnect substrate according to this embodiment, an insulating film (solder resist film 15) is formed on the substrate 11, and the opening 16 which has a tapered shape in which the diameter is increased upward and through which the upper surface of the electrode pad 13 is exposed is formed in the insulating film. The metal film 17 may be provided on the inclined side surface of the insulating film (solder resist film 15) in the opening 16.

It is possible to form a structure in which at least a portion of the edge of the upper surface of the metal film 17 is higher than the other portions of the upper surface by combining predetermined conditions. According to this structure, it is possible to further improve the adhesion between the solder ball 19 and the upper surface of the metal film 17. As a result, it is possible to improve the connection reliability of the semiconductor device and the yield of the semiconductor device.

In this embodiment, the insulating film (solder resist film 15) covers the edge of the upper surface of the electrode pad 13, and the metal film 17 is provided between the electrode pad 13 and the solder resist film 15.

According to the above-mentioned structure, it is possible to increase the area of the metal film 17 contacted with the solder ball 19 and increase the contact area of the solder ball 19. Therefore, it is possible to improve soldering strength.

The method of manufacturing the interconnect substrate according to this embodiment includes a step of forming the openings 16, which have a tapered shape in which the diameter is increased upward, and which the upper surfaces of the electrode pads 13 are exposed, in the solder resist film 15 and a step of depositing a metal material on the upper surface of the electrode pad 13 and the side surface of the solder resist film 15 in each of the openings 16. In this way, it is possible to easily form the metal film 17 in which at least a portion of the edge is higher than the other portions.

The method of manufacturing the interconnect substrate according to this embodiment includes a step of etching the upper surface of the electrode pad 13 that is exposed on the bottom surface of the opening 16 and the electrode pad 13 that is disposed below the solder resist film 15, before the step in which metal film 17 is formed. The step of forming the metal film 17 includes a step of forming the metal film 17 between the electrode pad 13 and the solder resist film 15.

According to the above-mentioned structure, it is possible to increase the area of the metal film 17 in contact with the solder ball 19 and increase the contact area of the solder ball 19. Therefore, it is possible to improve soldering strength.

Although the embodiment of the invention has been described above with reference to the drawings, the invention is not limited thereto. The invention may include various structures other than the above.

In this embodiment, the opening 16 has a tapered shape in which the diameter is increased upward. However, predetermined conditions, such as the shape of the opening 16 and the thicknesses of the undercut portions 13a and 13b and the metal film 17, may be appropriately changed such that at least a portion of the edge of the upper surface of the metal film 17 is higher than the other portions of the upper surface.

In this embodiment, the Ni/Au-plating films formed by an electroless plating method are used as the metal film 17, but the invention is not limited thereto. For example, Ni/Pd/Au-plating films formed by the electroless plating method or Ni/Au-plating films formed by an electrolytic plating method may be used as the metal film 17.

The structure of the electrode of the interconnect substrate and a method of manufacturing the same according to this embodiment may also be applied to the BGA pad of a printed interconnect board.

It is apparent that the present invention is not limited to the above embodiment, and may be modified and changed without departing from the scope and spirit of the invention.

What is claimed is:

1. An interconnect substrate comprising:
    a substrate;
    an electrode pad formed over said substrate;
    an insulating film formed over said substrate;
    an opening being formed in said insulating film, in which an upper surface of said electrode pad is exposed on a bottom surface of said opening, said opening has a tapered shape in which a diameter of the opening is increased upward; and
    a metal film formed over said upper surface of said electrode pad and an inclined side surface of said insulating film in said opening,
    wherein a height of a portion an upper surface of said metal film, which includes an edge of the upper surface of the metal film, is greater than another portion of said upper surface of said metal film,
    wherein said insulating film covers an edge of said upper surface of said electrode pad, and the metal film is formed between said electrode pad and said insulating film.

2. The interconnect substrate as set forth in claim 1, wherein the height of said upper surface of said metal film increases toward the edge of the upper surface of the metal film.

3. The interconnect substrate as set forth in claim 1, wherein the height of the portion of the upper surface of the metal film is less than a height of an uppermost portion of the insulating film.

4. The interconnect substrate as set forth in claim 1, further comprising a second metal film disposed over an exposed portion of the metal film.

5. The interconnect substrate as set forth in claim 4, wherein the second metal film includes an upper exposed surface including a portion that includes an edge, a height of the portion of the second metal film being greater than another portion of the upper exposed surface of the second metal film.

6. The interconnect substrate as set forth in claim 1, wherein the upper surface of the electrode pad comprises a first upper surface portion and a second upper surface portion, the second upper surface portion including a height which is greater than a height of the first upper surface portion.

7. The interconnect substrate as set forth in claim 6, wherein the opening is formed over the first upper surface portion of the electrode pad.

8. The interconnect substrate as set forth in claim 6, wherein the upper surface of the electrode pad further comprises an inclined upper surface portion that connects the first upper surface portion and the second upper surface portion of the electrode pad.

9. The interconnect substrate as set forth in claim 1, wherein the metal film has a thickness that is greater than a distance from a lower surface of the insulating film to an upper surface of the electrode pad in the opening.

10. The interconnect substrate as set forth in claim 1, wherein the upper surface of the metal film comprises a first upper surface and an inclined upper surface, the inclined upper surface comprising a first end at the first upper surface and a second end at the edge of the upper surface.

11. The interconnect substrate as set forth in claim 10, wherein the first upper surface and the inclined upper surface of the metal film are exposed by the opening formed in the insulating film.

12. The interconnect substrate as set forth in claim 1, wherein a lowest portion of the inclined side surface of the insulating film overhangs the upper surface of the electrode pad.

13. The interconnect substrate as set forth in claim 1, wherein the electrode pad is disposed on the substrate and the insulating film is disposed on the electrode pad, and
    wherein the metal film is disposed on the electrode pad at the opening of the insulating film.

14. The interconnect substrate as set forth in claim 1, wherein the upper surface of the metal film including the portion of the upper surface and the another portion of the upper surface, is exposed by the opening in the insulating film.

15. A semiconductor device comprising:
    said interconnect substrate as set forth in claim 1; and
    a semiconductor chip mounted over said metal film,
    wherein said semiconductor chip is electrically connected to said metal film through a solder ball.

16. The semiconductor device according to claim 15, wherein, the upper surface of the electrode pad comprises a first upper surface portion and a second upper surface portion, a height of the second upper surface portion is greater than a height of the first upper surface portion, and
    wherein the opening is formed over the first upper surface portion of the electrode pad.

17. The semiconductor device according to claim 15, wherein a distance from the substrate to the another portion of the upper surface of the metal film is larger than a distance from the substrate to a bottom surface of the insulating film.

18. The semiconductor device according to claim 15, wherein the metal film comprises nickel (Ni).

19. The semiconductor device according to claim 15, further comprising a BGA pad located on a surface of the interconnect substrate that is opposite to a surface of the interconnect substrate on which said semiconductor chip is mounted on.

20. The semiconductor device according to claim 19, further comprising a radiator plate provided on the semiconductor chip by an adhesive layer.

21. The semiconductor device according to claim 15, wherein the upper surface of the electrode pad has a depression, the depression being filled with the metal film.

22. The semiconductor device according to claim 21, wherein the opening of the insulating film is over the depression, and the insulating film covers an edge of the depression.

23. The semiconductor device according to claim 22, wherein the metal film covers a lower part of an edge of the insulating film.

24. The semiconductor device according to claim 23, wherein a width of a top of the depression is larger than a width of a bottom of the opening, and the width of the top of the depression is smaller than a width of a top of the opening.

25. The semiconductor device according to claim 24, further comprising a second metal film, the second metal film covering the metal film, wherein, in a cross sectional view, a width of the second metal film is larger than the width of the bottom of the opening, and the width of the second metal film is smaller than the width of the top of the opening.

26. A method of manufacturing an interconnect substrate, the method comprising:

forming an insulating film over a substrate comprising an electrode pad;

forming an opening having a tapered shape in which the diameter is increased upward, in which an upper surface of said electrode pad is exposed on a bottom surface of said opening, in said insulating film; and depositing a metal material over said upper surface of said electrode pad and an inclined side surface of said insulating film in said opening such that at least a portion of said metal material which includes an edge of the upper surface of the electrode pad, is greater in height than another portion of an upper surface of the metal material, wherein said insulating film covers the edge of said upper surface of said electrode pad and said metal material is formed between said electrode pad and said insulating film.

27. The method of manufacturing and interconnect substrate as set forth in claim 26, further comprising:

etching said upper surface of said electrode pad exposed on the bottom surface of said opening and said electrode pad disposed below said insulating film, before said depositing said metal material, wherein said depositing said metal material includes depositing said metal material between said electrode pad and said insulating film.

* * * * *

UNITED STATES PATENT AND TRADEMARK OFFICE
CERTIFICATE OF CORRECTION

PATENT NO. : 8,367,939 B2
APPLICATION NO. : 12/654017
DATED : December 8, 2009
INVENTOR(S) : Kiminori Ishido It is certified that error appears in the above-identified patent and that said Letters Patent is hereby corrected as shown below:

In particular, it is requested that the claims 16, 19, and 27 be corrected as follows:

claim 16, at column 8, line 32, change "wherein, the upper" to -- wherein the upper --;
claim 19, at column 8, line 47, change "mounted on" to -- mounted --;
claim 27, at column 10, line 7, change "manufacturing and interconnect" to -- manufacturing an interconnect --.

Signed and Sealed this
Eleventh Day of June, 2013

Teresa Stanek Rea
*Acting Director of the United States Patent and Trademark Office*